(12) United States Patent
Chang et al.

(10) Patent No.: US 6,785,136 B2
(45) Date of Patent: Aug. 31, 2004

(54) COUPLING MECHANISM FOR RADIATOR

(75) Inventors: Lin Wei Chang, Taipei (TW); Yi Ju Su, Taipei (TW)

(73) Assignee: Inventec Corporation, Taipei (TW)

( * ) Notice: Subject to any disclaimer, the term of this patent is extended or adjusted under 35 U.S.C. 154(b) by 185 days.

(21) Appl. No.: 10/162,076

(22) Filed: Jun. 5, 2002

(65) Prior Publication Data

US 2003/0228789 A1 Dec. 11, 2003

(51) Int. Cl.⁷ .................................................. H05K 7/20
(52) U.S. Cl. ........................ 361/704; 361/703; 257/718; 174/16.3; 165/80.3
(58) Field of Search ................................. 361/704–712, 361/717–724, 687, 688; 165/80.2, 80.3, 80.4, 185; 257/706–727; 248/316.7, 505, 510; 411/352, 516, 520, 522; 24/295, 457, 535–538, 458, 495, 505, 517; 174/16.3, 15.1

(56) References Cited

U.S. PATENT DOCUMENTS

| | | | |
|---|---|---|---|
| 6,304,453 B1 * | 10/2001 | Lo | 361/704 |
| 6,343,015 B1 * | 1/2002 | Huang et al. | 361/704 |
| 6,418,022 B1 * | 7/2002 | Chen | 361/704 |
| 6,452,801 B1 * | 9/2002 | Chen | 361/704 |
| 6,456,493 B1 * | 9/2002 | Lee | 361/704 |
| 6,477,048 B2 * | 11/2002 | Huang et al. | 361/704 |
| 6,501,656 B1 * | 12/2002 | Peng et al. | 361/703 |

FOREIGN PATENT DOCUMENTS

| | | | | |
|---|---|---|---|---|
| FR | 002813383 A3 | * | 3/2002 | F24D/19/02 |
| JP | 02000183578 A | * | 6/2000 | H05K/7/20 |

OTHER PUBLICATIONS

An Article Cooling Enhancement of Intel 386/486 by Clip–on Heat Sink. IBM Technical Disclosure Bulletin, Jul. 1990, us. vol. No. 33, Issue No. 2, P. Nos. 218–219.*

* cited by examiner

Primary Examiner—Michael Datskovsky
(74) Attorney, Agent, or Firm—Jacobson Holman PLLC

(57) ABSTRACT

A coupling mechanism for radiator aims to fasten a radiator to a heat generating element of a socket on a main board for absorbing the thermal energy generated by the heat generating element. The coupling mechanism includes a first anchor dock, a second anchor dock and a latch element. The first anchor dock and the second anchor dock are located on two opposite ends of the socket. The latch element passes through the gap of the radiation fins of the radiator and straddles the radiator. It has one end pivotally engaging with the first anchor dock and another end selectively engaging with the second anchor dock. The latch element further has an elastic section formed in the middle portion to put the radiator in close contact with the heat generating element. The coupling mechanism thus constructed can increase the surface area of the radiation fins of the radiator to achieve the maximum radiation effect.

21 Claims, 11 Drawing Sheets

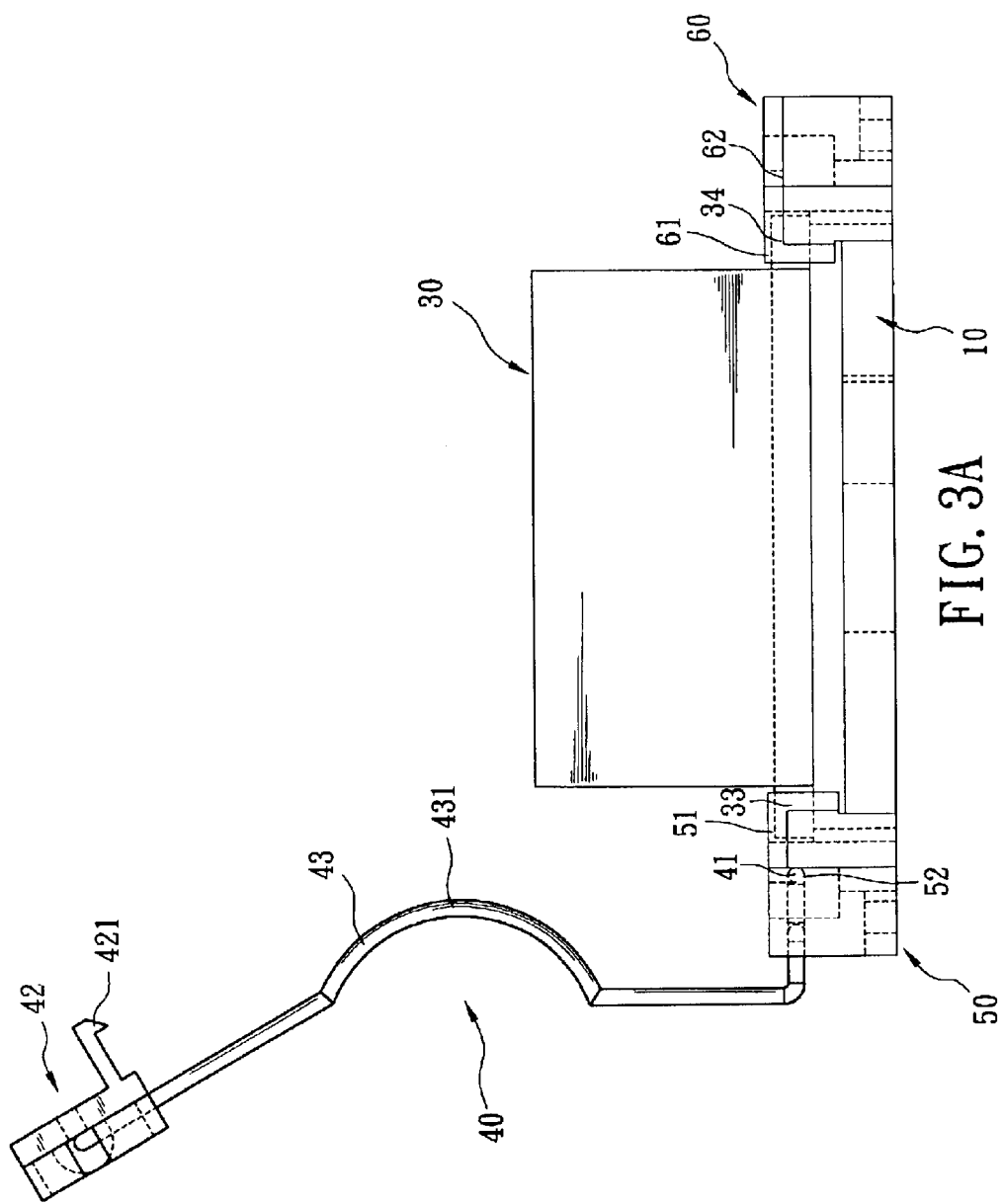

COUPLING MECHANISM FOR RADIATOR

FIELD OF THE INVENTION

The invention relates to a coupling mechanism for radiator to fasten the radiator to a central processing unit for absorbing thermal energy generated by the central processing unit and enabling the central processing unit to maintain normal operations.

BACKGROUND OF THE INVENTION

The central processing unit (CPU) is an indispensable element in a computer system. It performs the functions of calculating, logic processing, and interpreting commands, and it controls most other elements of the computer system.

Due to rapid technological innovation and development, the processing speed of CPUs is being improved constantly. Good radiation has becomes essential to keep the CPUs operating for a long period of time without overheating, suffering performance degradation, or decreasing durability. A general practice to address this concern is to install an air fan on the CPU or mount a metal radiator (usually made from aluminum or brass) onto the heat generating surface of the CPU. The radiator is generally made from material with excellent thermal conductivity. By making the radiator in direct contact with the CPU surface, thermal energy generated by the CPU can be dissipated so the CPU can stay within a selected temperature range to function normally.

The radiator mentioned above generally is attached to the CPU. In order to securely anchor the radiator, in the past, an adhesive was employed to bond the radiator to the CPU. However, the adhesive usually has poor thermal conductivity and cannot effectively transfer heat to the radiator, so the heat dissipation effect suffers. Moreover, adhesives generally melt at high temperatures. As a result, the bonding between the radiator and the CPU cannot be maintained at high temperatures.

Besides using adhesives, there are designs that employ coupling methods to fasten the radiator and the CPU. As the coupling methods do not interfere with the surface contact between the radiator and CPU, they are more effective and desirable.

Refer to FIG. 1A for a conventional coupling method. A CPU 20 is mounted to a CPU socket 10 and has a top surface in contact with a radiator 30. The radiator 30 and the socket 10 are coupled by a latch element 40. As the radiator 30 is anchored on the top of the CPU 20 and has a bottom side in contact with the top surface of the CPU 20. Heat generated by the CPU 20 can be dissipated through the radiator 30. However, such coupling requires a slot 31 cutting through the middle section of the radiator 30 to accommodate the latch element 40 in a straddling manner. As a result, the radiation surface of the radiation fins 32 located on the radiator 32 is decreased and the radiation effect suffers.

FIG. 1B shows another conventional coupling method that is located on two sides of the CPU socket 10. The coupling method has one latch element 40 coupled to one side of the CPU socket 10 and another latch element 40 coupled to the other side of the CPU socket 10 to make the CPU 20 in contact with the radiator 30 and achieve the radiation effect. However, the two latch elements 40 often cannot provide an equal coupling force on both sides of the radiator 30. As a result, the radiator 30 cannot evenly contact the top surface of the CPU 20 to provide uniform heat dissipation (usually the contact portion between the two is on a line rather than the whole surface). Therefore the radiation effect suffers.

In view of the concerns mentioned above, it is necessary to develop a coupling method for radiator that can increase the surface area of the radiation fins and keep the bottom surface of the radiator in contact with the CPU in an even manner in order to achieve the maximum radiation effect.

SUMMARY OF THE INVENTION

The primary object of the invention is to provide a coupling mechanism for radiator to increase the surface area of radiation fins to achieve the maximum radiation effect and keep the bottom surface of the radiator in contact evenly with the CPU.

The coupling mechanism of the invention involves fastening a radiator to a heat generating element of a socket on a main board for absorbing the thermal energy generated by the heat generating element. The coupling mechanism includes a first anchor dock, a second anchor dock and a latch element. The first anchor dock is located on one end of the socket. The second dock is located on the other end of the socket opposite the first anchor dock. The latch element passes through the gap of the radiation fins of the radiator and straddles the radiator. It has one end pivotally engaging with the first anchor dock and another end selectively engaging with the second anchor dock. The latch element further has an elastic section formed in the middle portion thereof to put the radiator in close contact with the heat generating element.

When in use, first, put the radiator in contact with the heat generating element, then pivotally engage one end of the latch element with the first anchor dock. With the end of the latch element that engages with the first anchor dock serving as the axis, turn the latch element over the radiator to slip into the gap of the radiation fins on the radiator such that the latch element straddles the radiator. Then move another end of the latch element towards the second anchor dock and press the elastic section against the radiator to put the radiator in close contact with the heat generating element. Finally, fasten another end of the latch element to the second anchor dock to complete the coupling of the radiator and the heat generating element.

The foregoing, as well as additional objects, features and advantages of the invention will be more readily apparent from the following detailed description, which proceeds with reference to the accompanying drawings.

BRIEF DESCRIPTION OF THE DRAWINGS

FIGS. 3A through 3D are schematic views of the invention in various moving conditions.

DESCRIPTION OF THE PREFERRED EMBODIMENTS

The invention aims at providing a coupling mechanism for radiator to fasten a radiator 30 to a heat generating element (such as a CPU 20) of a socket 10 on a main board to absorb thermal energy generated by the heat generating element.

Figure 1A:
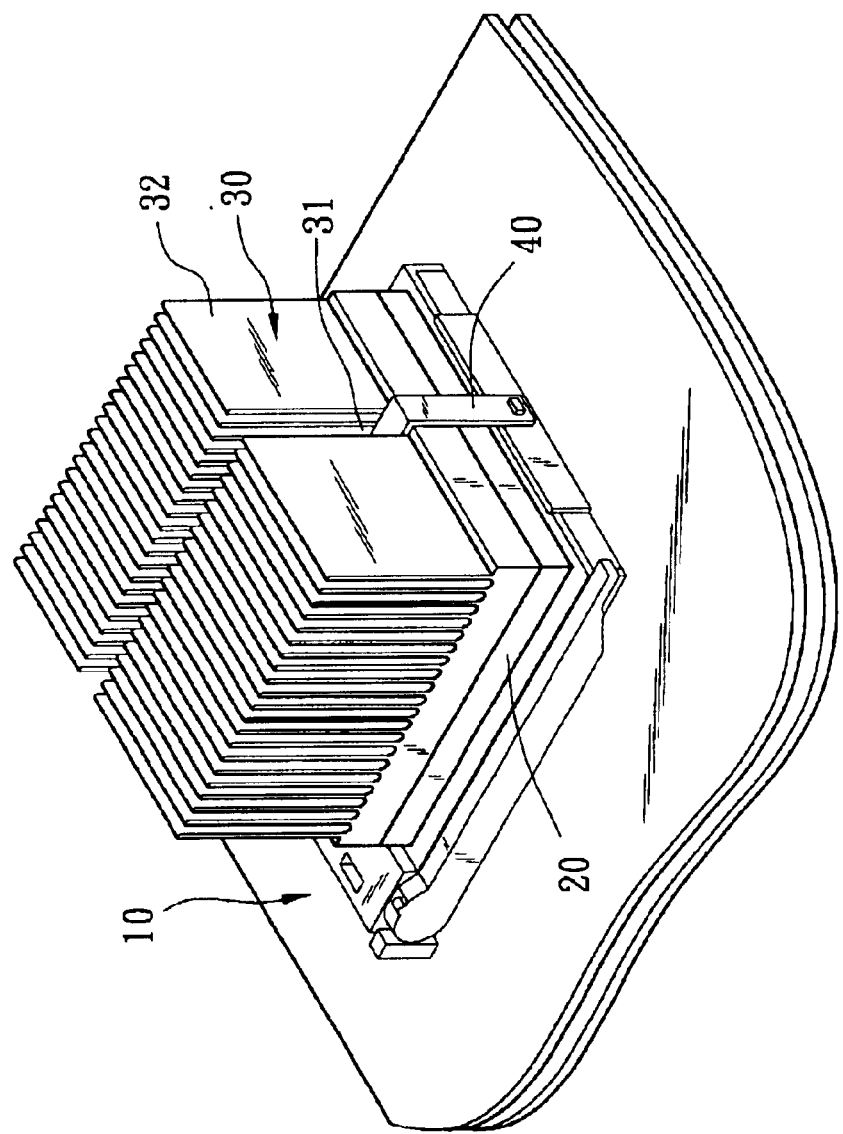
FIGS. 1A and 1B are perspective views of conventional coupling methods for radiator.
Figure 1B:
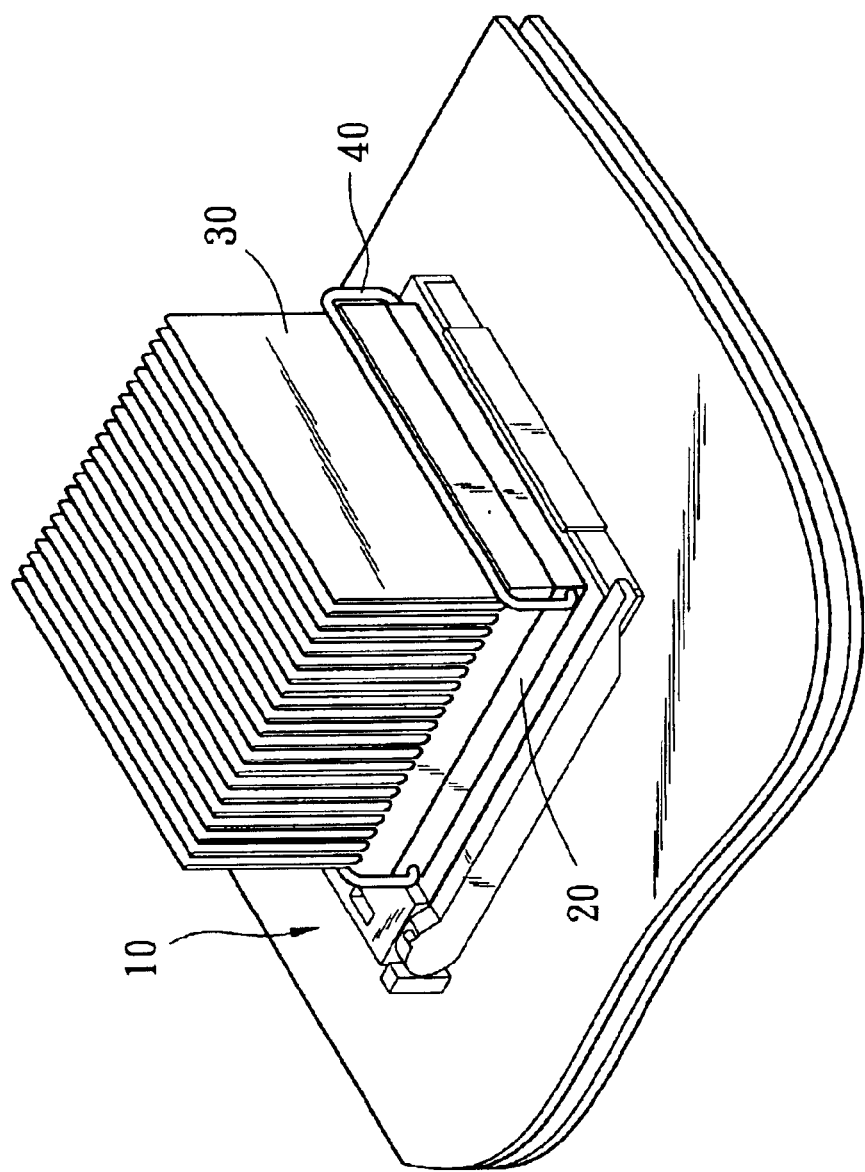
Figure 2:
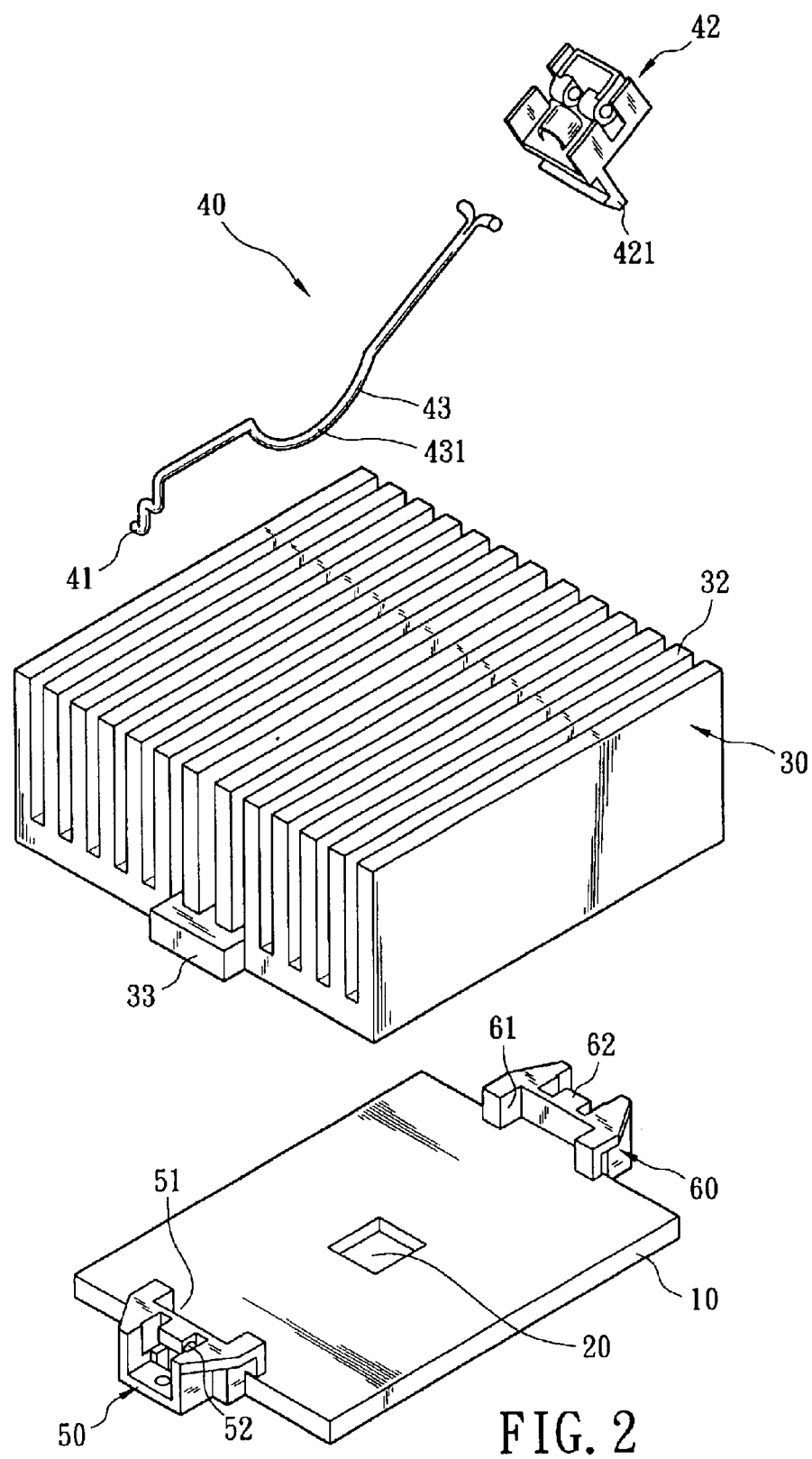
FIG. 2 is an exploded view of the invention.

Referring to FIG. 2, the coupling mechanism of the invention consists of a first anchor dock 50, a second anchor dock 60 and a latch element 40.

The first anchor dock 50 is located on one end of the socket 10, and has a first trough 51 and a first latch notch 52. The first trough 51 corresponds to a first lug 33 located on one end of the radiator 30 for anchoring one end of the radiator 30 to the flat surface where the socket 10 is mounted.

Figure 3B:
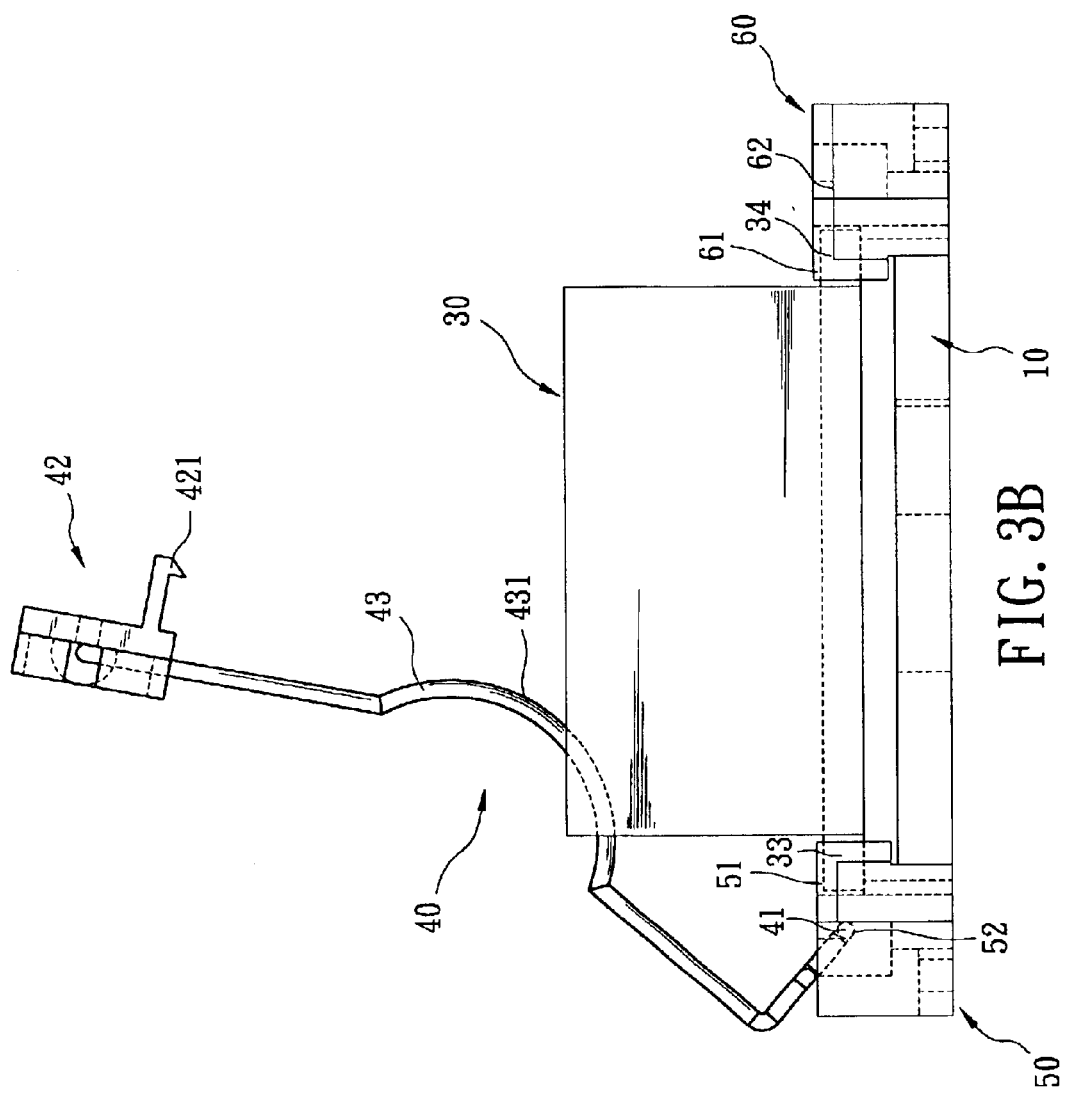
Figure 3C:
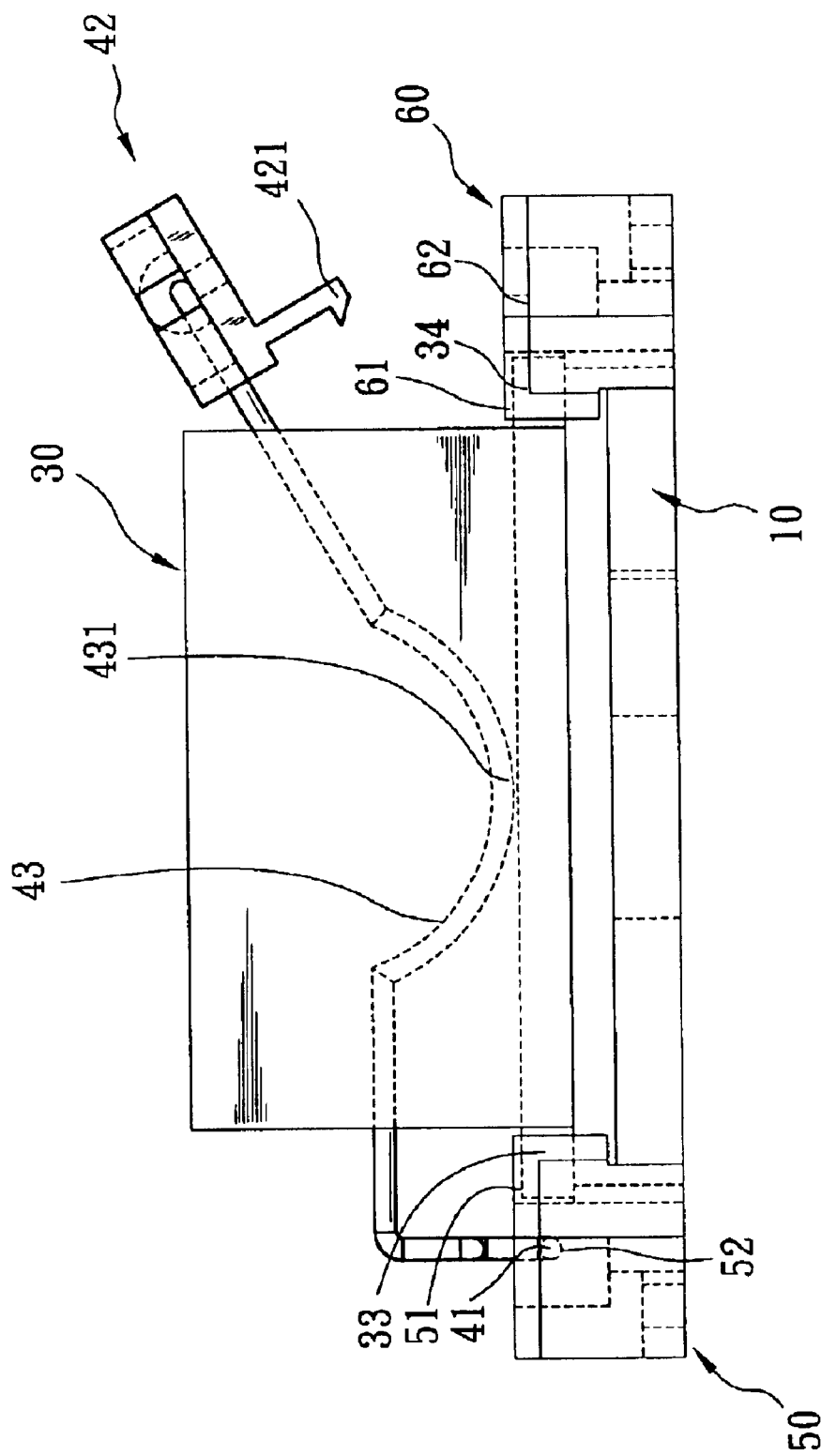
Figure 3D:
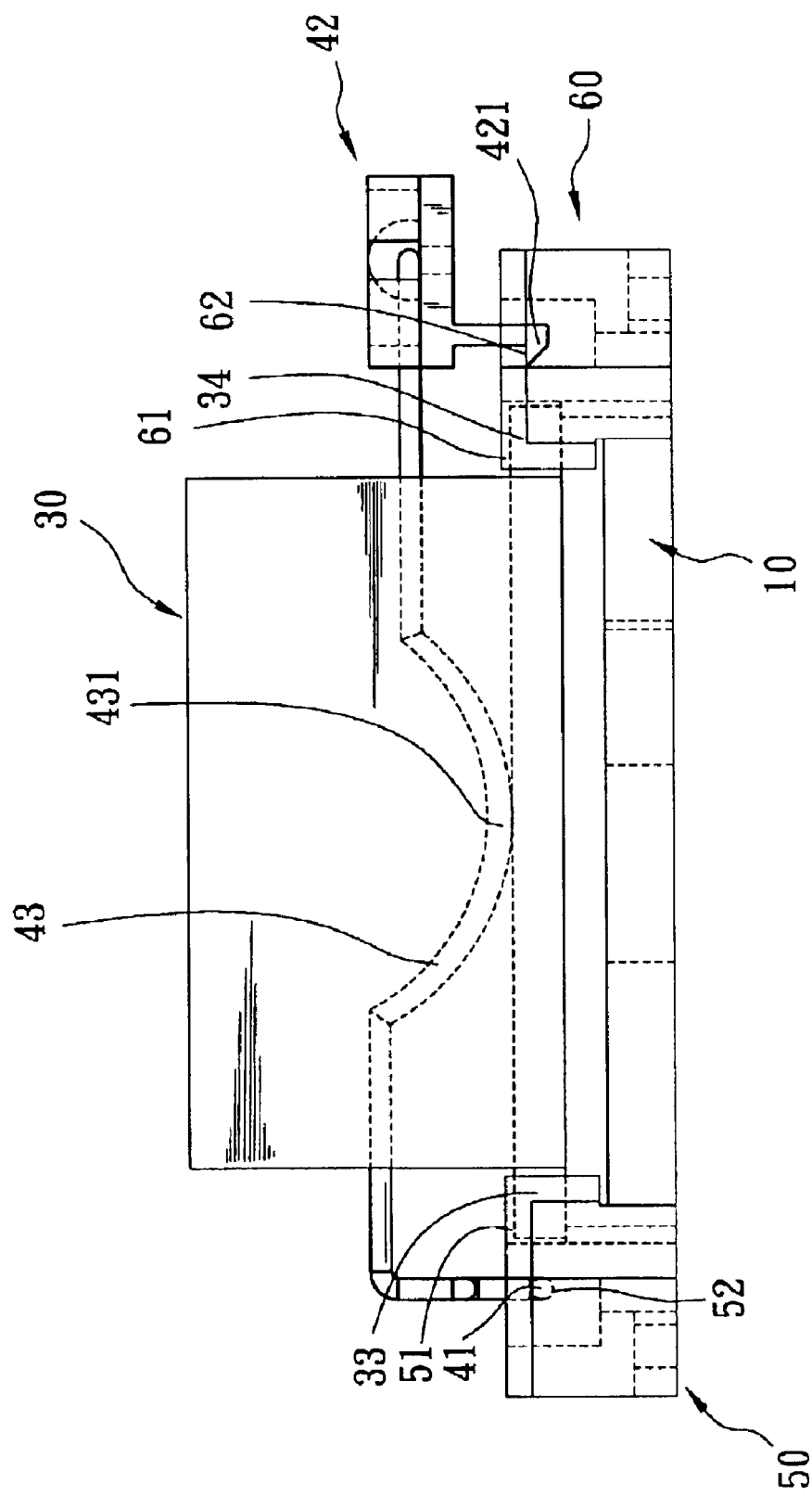

The second anchor dock 60 is located on the other end of the socket 10 opposite the first anchor dock 50, and has a second trough 61 and a first latch flange 62. The second trough 62 corresponds to a second lug 34 (also referring to FIG. 3A) located on the other end of the radiator 30 for anchoring the other end of the radiator 30 to the flat surface where the socket 10 is mounted.

The latch element 40 passes through a gap of a plurality of radiation fins 32 located on the radiator 30 and straddles on the radiator 30. The latch element 40 also has one end forming a first stub shaft 41 corresponding to the first latch notch 52 and passing through the first latch notch 52 to pivotally engage with the first anchor dock 50. The latch element 40 further has another end engaging with a latch head 42, which corresponds to the first latch flange 62. The latch head 42 has a hook 421 that can engage with the first latch flange 62 and enable the latch element 40 to fasten to the second anchor dock 60. The latch element 40 has an elastic section 43 formed in the middle portion thereof to put the radiator 30 in close contact with the heat generating element. The elastic section 43 may be formed in an arched shape 431 or a pointed shape (an arched shape 431 is shown in the drawings).

Referring to FIGS. 3A through 3D, when in use, first, put the radiator 30 in contact with the heat generating element. Then, with the end of the latch element 40 that engages with the first anchor dock 50 as the axis, turn the latch element 40 over the radiator 30 to slip into the gap of the radiation fins 32 on the radiator 30 so that the latch element 40 straddles the radiator 30. Then move the latch head 42 towards the first latch flange 62 and press the elastic section 43 against the radiator 30 to put the radiator 30 in close contact with the heat generating element. Finally, engage the hook 421 with the first latch flange 62 to complete coupling of the radiator 30 and the heat generating element. Such a coupling mechanism enables the bottom surface of the radiator 30 to be in close and even contact with the heat generating element. To release the coupling relationship between the radiator 30 and the heat generating element, press the latch head 42 and turn the latch head 42 to disengage the hook 421 from the first latch flange 62. Then the latch element 40 may be moved away from the radiator 30, and the radiator 30 may be separated from the heat generating element.

Figure 4:
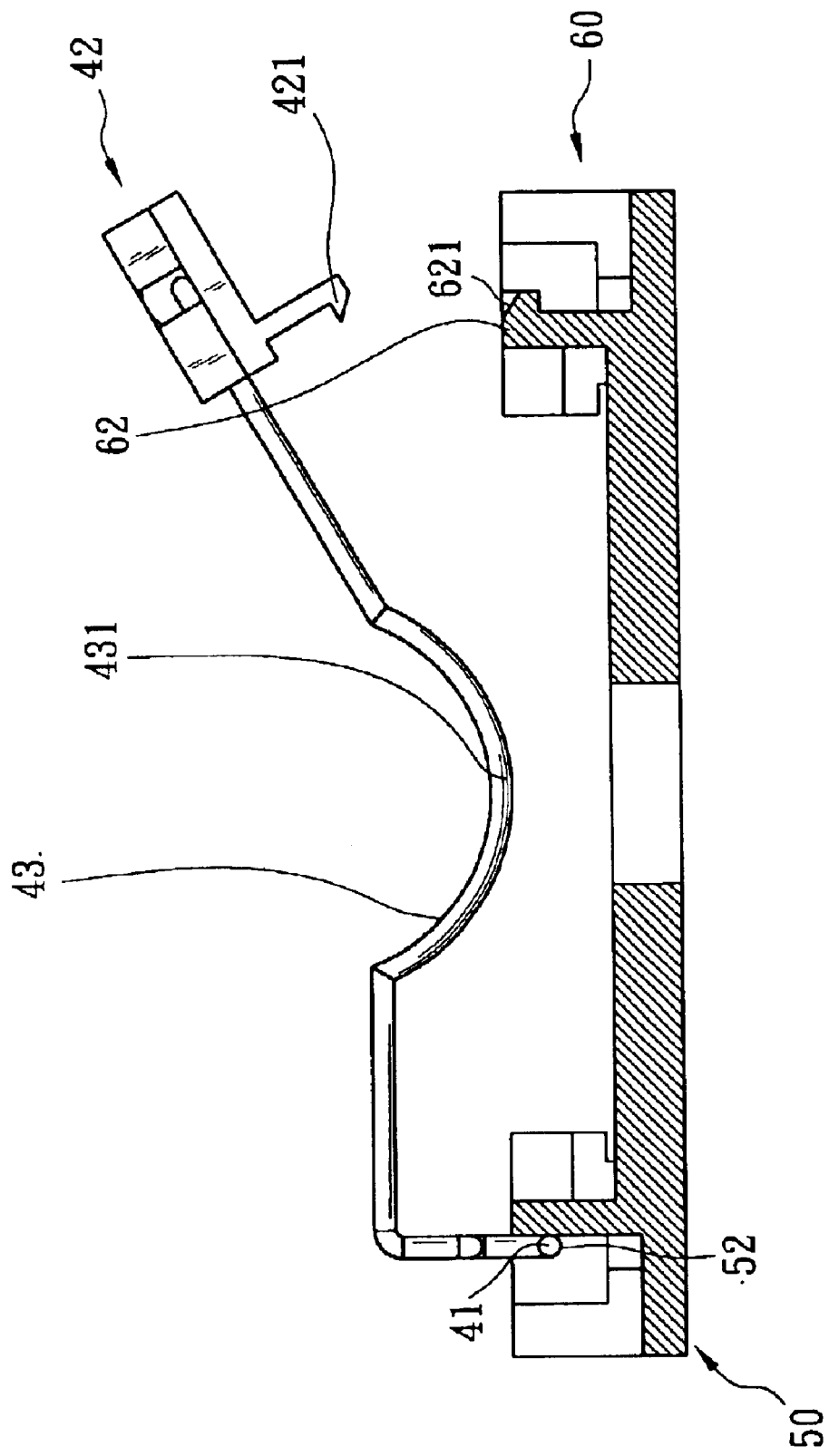
FIG. 4 is a cross section of the first latch flange of the invention.

Referring to FIG. 4, the first latch flange 62 may also have a chamfered angle 621 to make engaging between the latch head 42 and the first latch flange 62 easier.

Figure 5:
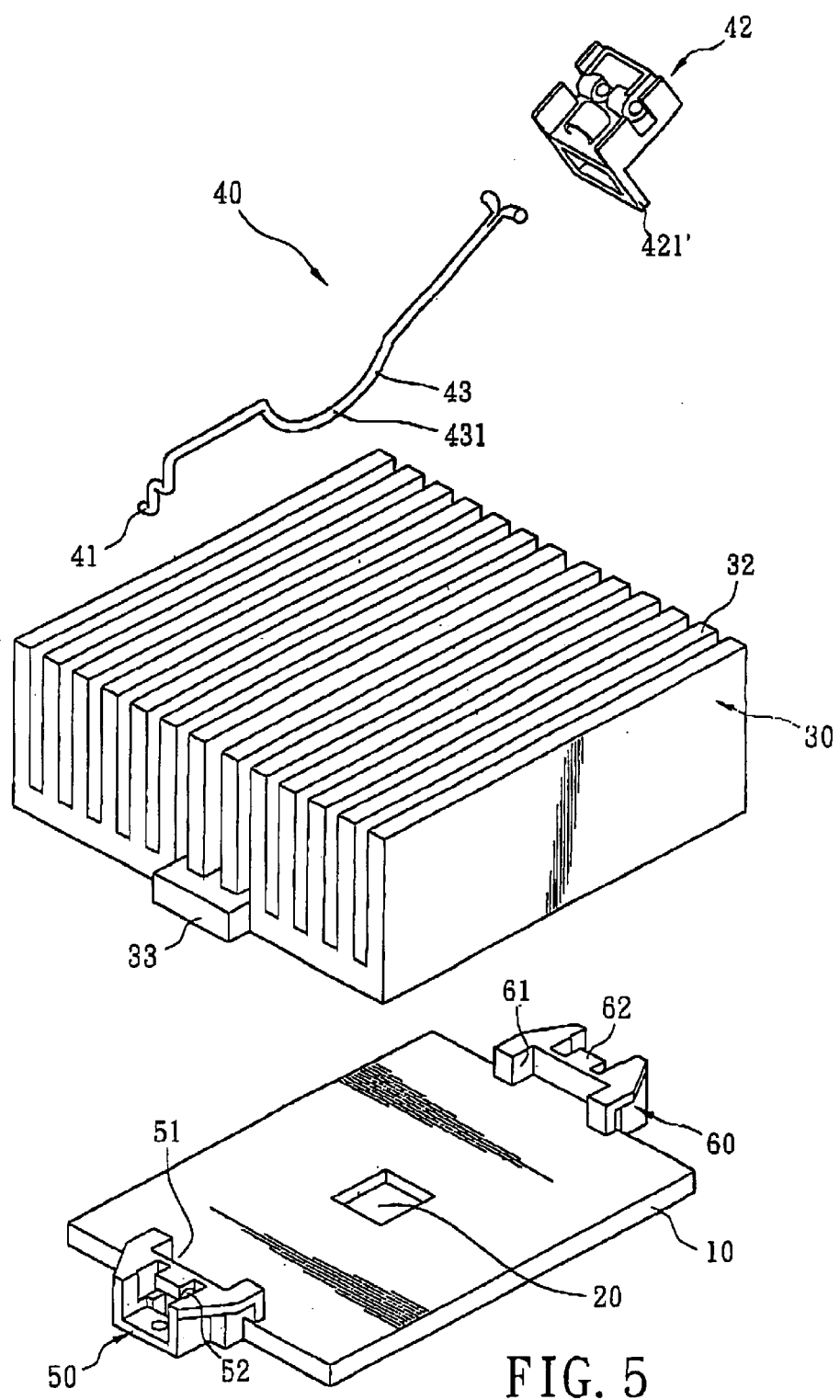
FIG. 5 is a perspective view of another embodiment of the latch head of the invention.

Referring to FIG. 5, the hook 421 of the latch head 42 may also be substituted by a latch ring 421'. When the latch element 40 is in use, as previously discussed, engage the latch ring 421' with the first latch flange 62, then the radiator 30 may be coupled with the heat generating element. Releasing the coupling of the radiator 30 and the heat generating element may also be done by pressing and turning the latch head 42 to disengage the latch ring 421' from the first latch flange 62.

Figure 6:
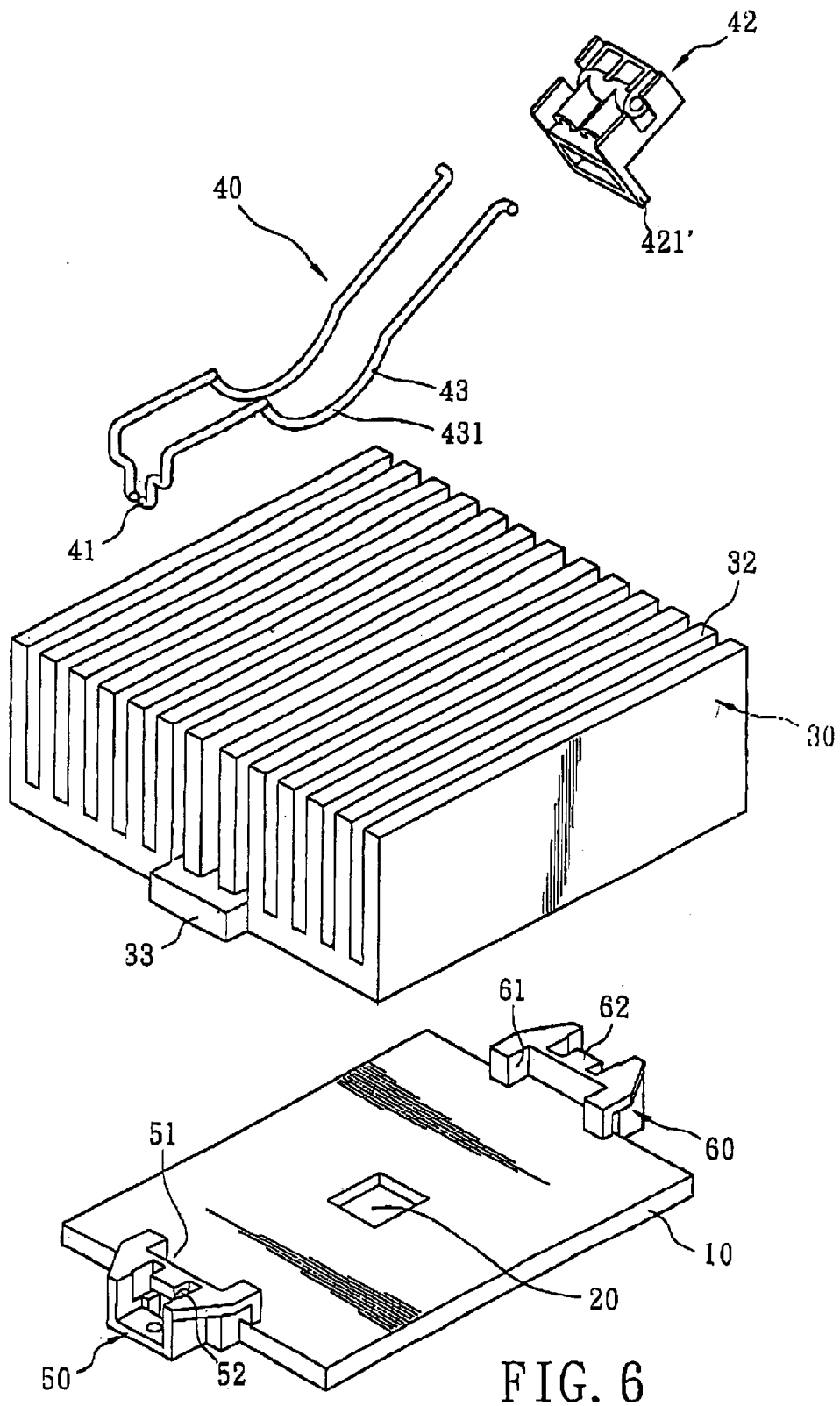
FIG. 6 is an exploded view of another embodiment of the invention.

Refer to FIG. 6 for another embodiment of the invention. In this embodiment, there are two latch elements 40, each having an elastic section 43 to slip into the gap of the radiation fins 32 on the radiator 30 and straddle the radiator 30. Such a construction enables different elastic sections 43 to provide the same pressure so that the bottom surface of the radiator 30 can evenly contact the heat generating element. This construction also increases the coupling force between the radiator 30 and the heat generating element.

Figure 7:
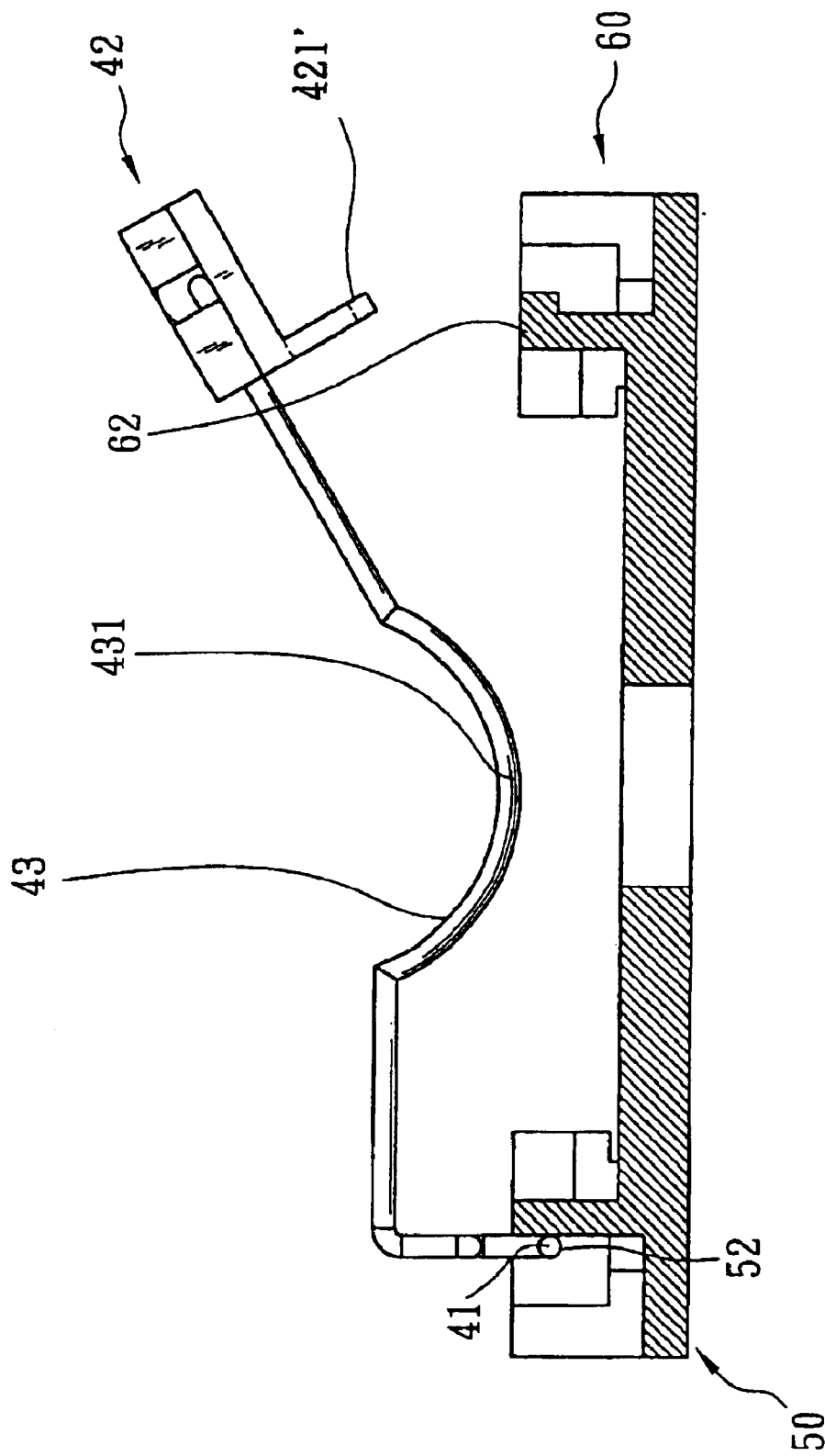
FIG. 7 is a schematic view of another embodiment of the invention in use.

FIG. 7 illustrates the latching and disengaging relationships for the embodiment shown in FIG. 6. The operations are substantially the same as those set forth above. Of course, more than two latch elements 40 may be employed if desired.

In summary, the coupling mechanism for radiator of the invention can achieve the following effects:

1. The invention increases the surface area of the radiation fins of the radiator, thus enabling the radiator to achieve the maximum radiation effect.
2. The invention enables the bottom surface of the radiator to evenly contact the CPU to effectively achieve radiation. When the latch element has a plurality of elastic sections, each elastic section can provide the same pressure.
3. The invention is simple to install and disassemble.

While the preferred embodiments of the invention have been set forth for the purpose of disclosure, modifications of the disclosed embodiments of the invention as well as other embodiments thereof may occur to those skilled in the art. Accordingly, the appended claims are intended to cover all embodiments which do not depart from the spirit and scope of the invention.

What is claimed is:

1. A coupling mechanism for a radiator to fasten the radiator to a heat generating element of a socket on a main board to absorb thermal energy generated by the heat generating element, said coupling mechanism comprising:

a first anchor dock located on one end of the socket;

a second anchor dock located on the other end of the socket opposite the first anchor dock; and a latch element passing through a gap of a plurality of radiation fins of the radiator and straddling on the radiator, and having one end pivotally engaging with the first anchor dock, and another end selectively engaging with the second anchor dock, and an elastic section formed in a middle portion thereof to put the radiator in close contact with the heat generating element, the first anchor dock having a first trough corresponding to a first lug located on one end of the radiator for anchoring the one end of the radiator to a flat surface where the socket is mounted.

2. The coupling mechanism for radiator of claim 1, wherein the second anchor dock has a second trough corresponding to a second lug located on the other end of the radiator for anchoring the other end of the radiator to the flat surface where the socket is mounted.

3. The coupling mechanism for radiator of claim 1, wherein the first anchor dock has a first latch notch, the latch element having a first stub shaft corresponding to the first latch notch such that the latch element is allowed to pass through the first latch notch to pivotally engage with the first anchor dock.

4. The coupling mechanism for radiator of claim 1, wherein the second anchor dock has a first latch flange, the latch element having a latch head corresponding to and engageable with the first latch flange.

5. The coupling mechanism for radiator of claim 4, wherein the latch head has a hook that can engage with the first latch flange.

6. The coupling mechanism for radiator of claim 4, wherein the latch head has a latch ring.

7. The coupling mechanism for radiator of claim 4, wherein the first latch flange has a chamfered angle to make engaging between the latch head and the first latch flange easier.

8. A coupling mechanism for a radiator to fasten the radiator to a heat generating element of a socket on a main board to absorb thermal energy generated by the heat generating element, said coupling mechanism comprising:

a first anchor dock located on one end of the socket;

a second anchor dock located on the other end of the socket opposite the first anchor dock; and a latch element passing through a gap of a plurality of radiation fins of the radiator and straddling on the radiator, and having one end pivotally engaging with the first anchor dock, and another end selectively engaging with the second anchor dock, and an elastic section formed in a middle portion thereof to put the radiator in close contact with the heat generating element, the first anchor dock having a first latch notch, the latch element having a first stub shaft corresponding to the first latch notch such that the latch element is allowed to pass through the first latch notch to pivotally engage with the first anchor dock.

9. The coupling mechanism for radiator of claim 8, wherein the first anchor dock has a first trough corresponding to a first lug located on one end of the radiator for anchoring the one end of the radiator to a flat surface where the socket is mounted.

10. The coupling mechanism for radiator of claim 9, wherein the second anchor dock has a second trough corresponding to a second lug located on the other end of the radiator for anchoring the other end of the radiator to the flat surface where the socket is mounted.

11. The coupling mechanism for radiator of claim 8, wherein the second anchor dock has a first latch flange, the latch element having latch head corresponding to and engageable with the first latch flange.

12. The coupling mechanism for radiator of claim 11, wherein the latch head has a hook that can engage with the first latch flange.

13. The coupling mechanism for radiator of claim 11, wherein the latch h ad has a latch ring.

14. The coupling mechanism for radiator of claim 11, wherein the first latch flange has a chamfered angle to make engaging between the latch head and the first latch flange easier.

15. A coupling mechanism for a radiator to fasten the radiator to a heat generating element of a socket on a main board to absorb thermal energy generated by the heat generating element, said coupling mechanism comprising:

a first anchor dock located on one end of the socket;

a second an or dock located on the other end of the socket opposite the first anchor dock; and a latch element passing through a gap of a plurality of radiation fins of the radiator and straddling on the radiator, and having one end pivotally engaging with the first anchor dock, and another end selectively engaging with the second anchor dock, and an elastic section formed in a middle portion thereof to put the radiator in close contact with the heat generating element, the second anchor dock having a first latch flange, the latch element having a latch head corresponding to and engageable with the first latch flange.

16. The coupling mechanism for radiator of claim 15, wherein the first a anchor dock has a first trough corresponding to a first lug located on one end of the radiator for anchoring the one end of the radiator to a flat surface where the socket is mounted.

17. The coupling mechanism for radiator of claim 16, wherein the second anchor dock has a second trough corresponding to a second lug located on the other end of the radiator for anchoring the other end of the radiator to the flat surface where the socket is mounted.

18. The coupling mechanism for radiator of claim 15, wherein the first anchor dock has a first latch notch, the latch element having a first stub shaft corresponding to the first latch notch such that the latch element is allowed to pass through the first latch notch to pivotally engage the first anchor dock.

19. The coupling mechanism for radiator of claim 15, wherein the latch head has a hook that can engage with the first latch flange.

20. The coupling mechanism for radiator of claim 15, wherein the latch head has a latch ring.

21. The coupling mechanism for radiator of claim 15, wherein the first latch flange has a chamfered angle to make engaging between the latch head and the first latch flange easier.

* * * * *